(12) United States Patent
Kariya et al.

(10) Patent No.: US 11,581,163 B2
(45) Date of Patent: Feb. 14, 2023

(54) ION IMPLANTER AND ION IMPLANTATION METHOD

(71) Applicant: SUMITOMO HEAVY INDUSTRIES ION TECHNOLOGY CO., LTD., Tokyo (JP)

(72) Inventors: Hiroyuki Kariya, Ehime (JP); Yuuji Takahashi, Ehime (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 385 days.

(21) Appl. No.: 16/930,902

(22) Filed: Jul. 16, 2020

(65) Prior Publication Data

US 2021/0020401 A1 Jan. 21, 2021

(30) Foreign Application Priority Data

Jul. 19, 2019 (JP) .............................. JP2019-133352

(51) Int. Cl.
  *H01J 37/304* (2006.01)
  *C23C 14/48* (2006.01)
  *H01J 37/317* (2006.01)

(52) U.S. Cl.
  CPC ............ *H01J 37/304* (2013.01); *C23C 14/48* (2013.01); *H01J 37/3171* (2013.01)

(58) Field of Classification Search
  CPC .... H01J 37/244; H01J 37/304; H01J 37/3171; H01J 37/1472; H01J 37/3023; H01J 2237/24405; H01J 2237/31703; H01J 2237/30455; H01J 2237/30483
  See application file for complete search history.

(56) References Cited

U.S. PATENT DOCUMENTS 7,433,020 B2 * 10/2008 Asaishi ................... G01J 1/429
  355/71
2009/0224151 A1 * 9/2009 Hatakeyama ........... H01J 37/28
  250/307

FOREIGN PATENT DOCUMENTS

JP    2006-041046 A    2/2006
JP      5500955 B2    5/2014

* cited by examiner

Primary Examiner — David E Smith
Assistant Examiner — Hsien C Tsai
(74) Attorney, Agent, or Firm — Michael Best & Friedrich LLP

(57) ABSTRACT

An ion implanter includes an implantation processing chamber in which an implantation process of irradiating a wafer with an ion beam is performed, a first Faraday cup disposed inside the implantation processing chamber to measure a beam current of the ion beam during a preparation process performed before the implantation process, a second Faraday cup disposed inside the implantation processing chamber to measure a beam current of the ion beam during a calibration process for calibrating a beam current measurement value of the first Faraday cup, and a blockade member for blocking the ion beam directed toward the second Faraday cup, the blockade member being configured so that the ion beam is not incident into the second Faraday cup during the implantation process and the preparation process, and the ion beam is incident into the second Faraday cup during the calibration process.

20 Claims, 8 Drawing Sheets

ION IMPLANTER AND ION IMPLANTATION METHOD

RELATED APPLICATIONS

The content of Japanese Patent Application No. 2019-133352, on the basis of which priority benefits are claimed in an accompanying application data sheet, is in its entirety incorporated here by reference.

BACKGROUND

Technical Field

Certain embodiments of the present invention relate to an ion implanter and an ion implantation method.

Description of Related Art

In a semiconductor manufacturing process, a process of implanting ions into a semiconductor wafer (also referred to as an ion implantation process) is generally performed in order to change conductivity of a semiconductor, or in order to change a crystal structure of the semiconductor. In order to more accurately measure a current amount of an ion beam with which the wafer is irradiated, a configuration has been proposed as follows. Another current detector for calibration is disposed on a drive stage, separately from a current detector used for normal implantation. For example, in the related art, the current detector for calibration is used to calibrate the current detector for normal use when the current detector for normal use is replaced.

SUMMARY

According to an embodiment of the present invention, there is provided an ion implanter including an implantation processing chamber in which an implantation process of irradiating a wafer with an ion beam is performed, a first Faraday cup disposed inside the implantation processing chamber to measure a beam current of the ion beam during a preparation process performed before the implantation process, a second Faraday cup disposed inside the implantation processing chamber to measure a beam current of the ion beam during a calibration process for calibrating a beam current measurement value of the first Faraday cup, and a blockade member for blocking the ion beam directed toward the second Faraday cup. The blockade member is configured so that the ion beam is not incident into the second Faraday cup during the implantation process and the preparation process, and the ion beam is incident into the second Faraday cup during the calibration process.

According to another embodiment of the present invention, there is provided an ion implantation method. The ion implantation method includes an implantation process of irradiating a wafer with an ion beam, a preparation process of measuring a beam current of the ion beam by using a first Faraday cup before the implantation process, and a calibration process of measuring the beam current of the ion beam by using a second Faraday cup and calibrating a beam current measurement value of the first Faraday cup. During the implantation process and the preparation process, the ion beam directed toward the second Faraday cup is blocked by a blockade member and the ion beam is not incident into the second Faraday cup, and during the calibration process, the ion beam is incident into the second Faraday cup.

DETAILED DESCRIPTION

Figure 1:
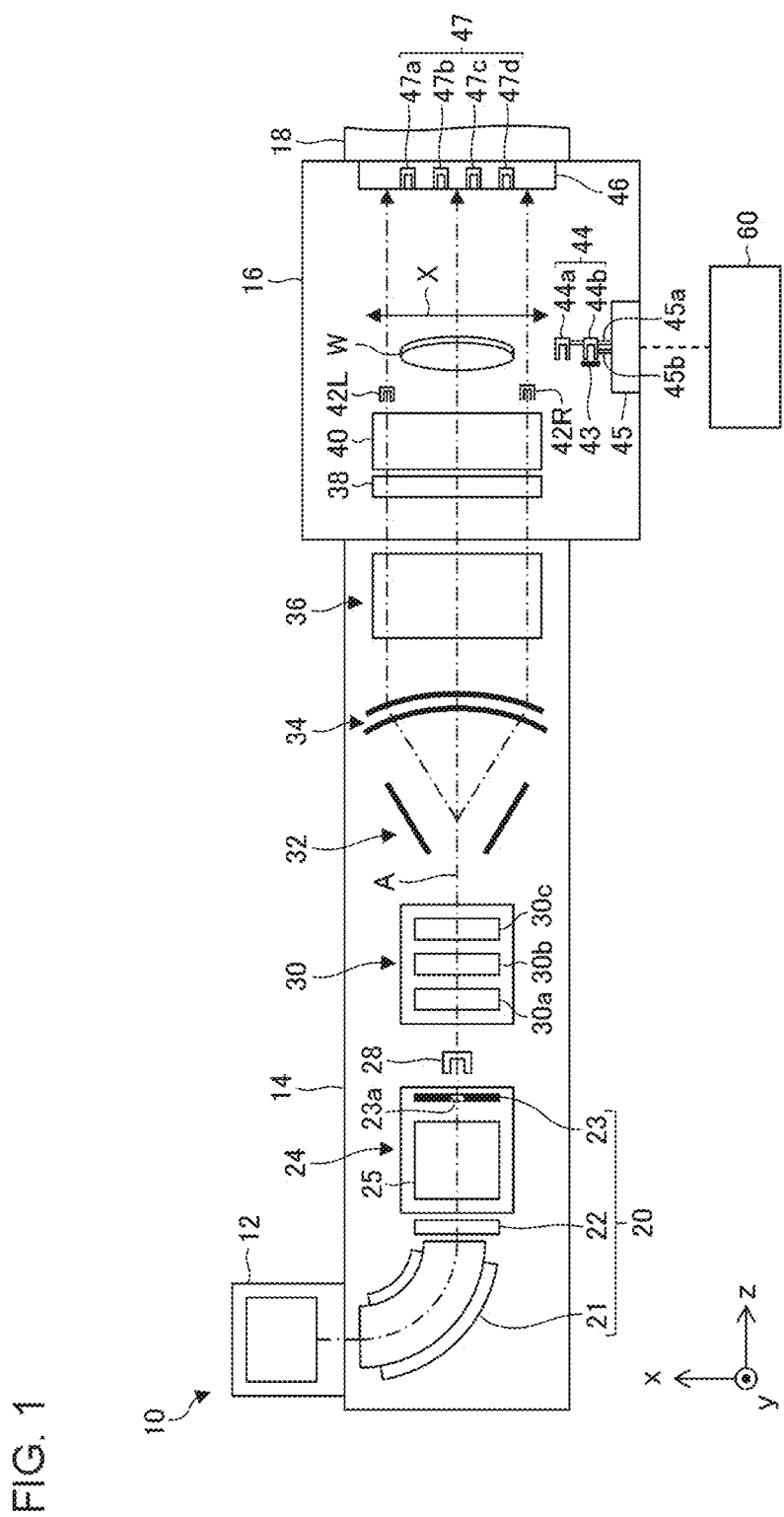
FIG. 1 is a top view illustrating a schematic configuration of an ion implanter according to an embodiment.

In a case where a current detector for calibration is disposed on a drive stage, there is a possibility that the current detector for calibration may be worn out or get dirty due to long-term use. When the current detector for calibration is worn out or gets dirty, measurement accuracy of the current detector for calibration is degraded. Consequently, when a current detector for normal use is replaced, the current detector for normal use cannot be accurately calibrated.

It is desirable to provide a technique for maintaining accuracy in measuring a beam current over a long period of time.

Any desired combination of the above-described configuration elements, and those in which the configuration elements or expressions according to the present invention are substituted from each other in methods, devices, or systems are effectively applicable as an aspect of the present invention.

According to the embodiments of the present invention, the accuracy in measuring the beam current can be maintained over a long period of time.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Before the embodiments are described in detail, an outline will be described. An ion implanter according to the present embodiment includes an implantation processing chamber for performing an implantation process of irradiating a wafer with an ion beam. The implantation processing chamber internally has a first Faraday cup that measures a beam current during a preparation process performed before the implantation process, a second Faraday cup that measures a beam current in a calibration process for calibrating the first Faraday cup, and a blockade member for blocking the ion beam directed toward the second Faraday cup. The blockade member is configured so that the ion beam is not incident into the second Faraday cup during the implantation process and the preparation process, and the ion beam is incident into the second Faraday cup during the calibration process.

The first Faraday cup is repeatedly used to measure the beam current during the preparation process. Accordingly, the first Faraday cup is worn out or gets dirty due to continuous use of the ion implanter. When the Faraday cup is worn out or gets dirty, accuracy in measuring by the Faraday cup is degraded. Consequently, maintenance work such as cleaning or replacement is periodically required. In a case where the maintenance work is carried out for the first Faraday cup, measurement sensitivity of the first Faraday cup may be changed before and after the maintenance work. Accordingly, it is necessary to calibrate a measurement value of the first Faraday cup by using the second Faraday cup for calibration after the maintenance work.

According to the present embodiment, the second Faraday cup for calibration is disposed in an implantation processing chamber. Accordingly, measurement for calibrating the first Faraday cup can be performed inside the implantation processing chamber. Therefore, it is possible to properly calibrate also a change in the measurement sensitivity which is caused by a factor other than wear or dirt of the first Faraday cup, such as mounting accuracy of the first Faraday cup after the maintenance work. In addition, according to the present embodiment, the blockade member is provided. By the blockade member, it is possible to prevent the second Faraday cup from being worn out or getting dirty due to irradiation with the ion beam during a process other than the calibration process. Therefore, measurement accuracy of the second Faraday cup can be maintained over a long period of time. As a result, the measurement accuracy of the second Faraday cup can be maintained over a long period of time during which the maintenance work for the first Faraday cup is carried out multiple times. Calibration accuracy of the first Faraday cup for normal measurement can be maintained in a highly controlled state.

Figure 2:
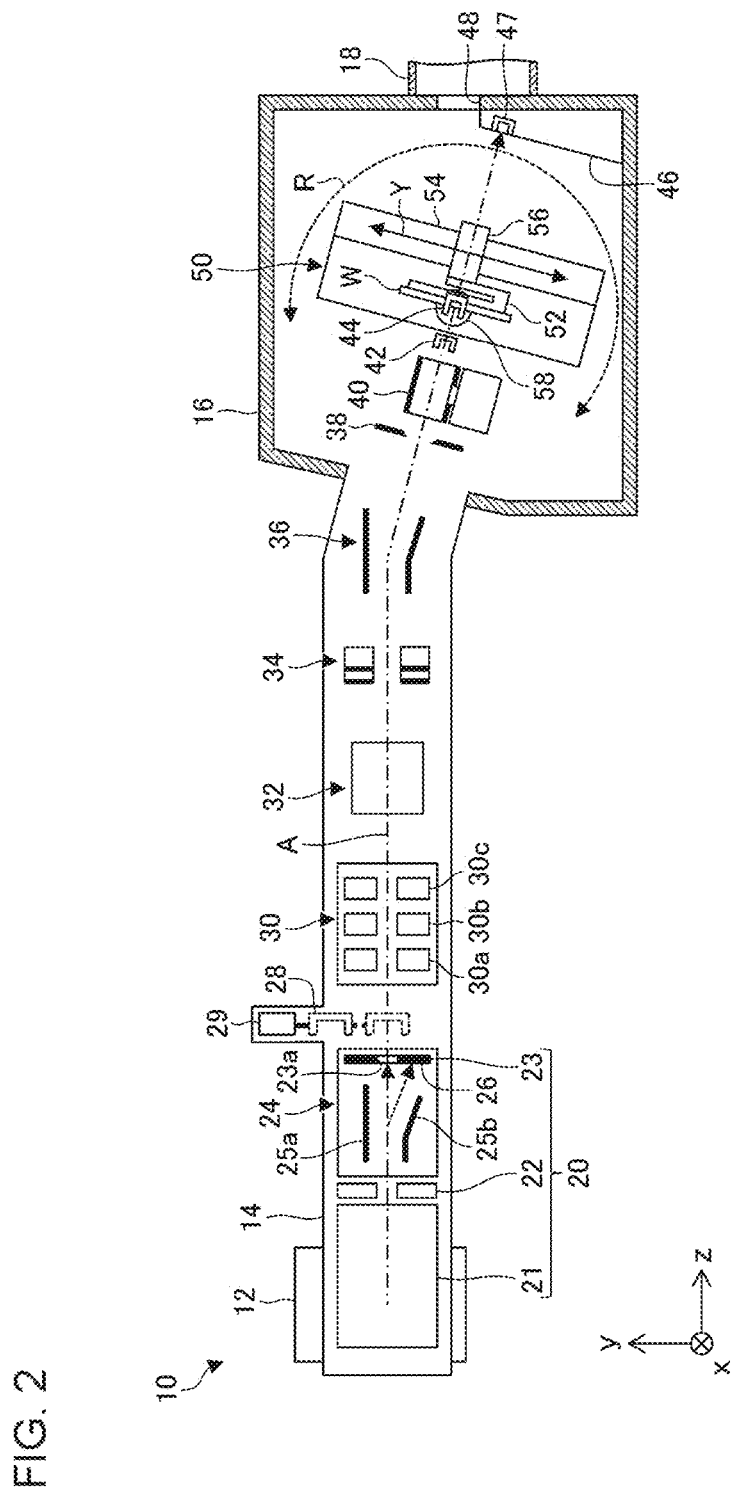
FIG. 2 is a side view illustrating a schematic configuration of the ion implanter in FIG. 1.

FIG. 1 is a top view schematically illustrating an ion implanter 10 according to an embodiment, and FIG. 2 is a side view illustrating a schematic configuration of the ion implanter 10. The ion implanter 10 is configured to perform an ion implantation process on a surface of a workpiece W. For example, the workpiece W is a substrate, and is a semiconductor wafer. For convenience of description, the workpiece W may be referred to as a wafer W in the specification herein. However, this is not intended to limit an implantation processing target to a specific object.

The ion implanter 10 is configured to irradiate a whole processing surface of the wafer W with the ion beam by performing reciprocating scanning using the ion beam in one direction and causing the wafer W to reciprocate in a direction perpendicular to the scanning direction. In the specification herein, for convenience of description, a traveling direction of the ion beam traveling along a designed beamline A is defined as a z-direction, and a plane perpendicular to the z-direction is defined as an xy-plane. In a case where the workpiece W is scanned with the ion beam, the scanning direction of the beam is defined as an x-direction, and a direction perpendicular to the z-direction and the x-direction is defined as a y-direction. Therefore, the reciprocating scanning using the beam is performed in the x-direction, and the wafer W reciprocates in the y-direction.

The ion implanter 10 includes an ion generator 12, a beamline device 14, an implantation processing chamber 16, and a wafer transfer device 18. The ion generator 12 is configured to provide the ion beam for the beamline device 14. The beamline device 14 is configured to transport the ion beam from the ion generator 12 to the implantation processing chamber 16. The implantation processing chamber 16 accommodates the wafer W serving as an implantation target, and an implantation process of irradiating the wafer W with the ion beam provided from the beamline device 14 is performed in the implantation processing chamber 16. The wafer transfer device 18 is configured to load an unprocessed wafer before the implantation process into the implantation processing chamber 16, and unload a processed wafer after the implantation process from the implantation processing chamber 16. The ion implanter 10 includes a vacuum system (not illustrated) for providing a desired vacuum environment for the ion generator 12, the beamline device 14, the implantation processing chamber 16, and the wafer transfer device 18.

The beamline device 14 includes a mass analyzing unit 20, a beam park device 24, a beam shaping unit 30, a beam scanning unit 32, a beam parallelizing unit 34, and an angular energy filter (AEF) 36, in order from an upstream side of a beamline A. The upstream side of the beamline A means a region closer to the ion generator 12, and a downstream region of the beamline A means a side closer to the implantation processing chamber 16 (or a beam stopper 46).

The mass analyzing unit 20 is disposed downstream of the ion generator 12, and is configured to select a required ion species from the ion beam extracted from the ion generator 12 by performing mass analyzing. The mass analyzing unit 20 has a mass analyzing magnet 21, a mass analyzing lens 22, and a mass analyzing slit 23.

The mass analyzing magnet 21 applies a magnetic field to the ion beam extracted from the ion generator 12, and deflects the ion beam to travel in a specific path in accordance with a value of the mass-to-charge ratio $M=m/q$ (here, m is mass, and q is charge) of the ions. For example, the mass analyzing magnet 21 applies the magnetic field in the y-direction (−y-direction in FIGS. 1 and 2) to the ion beam so that the ion beam is deflected in the x-direction. Strength of the magnetic field of the mass analyzing magnet 21 is adjusted so that the ion species having a desired mass-to-charge ratio M passes through the mass analyzing slit 23.

The mass analyzing lens 22 is disposed downstream of the mass analyzing magnet 21, and is configured to adjust focusing/defocusing power for the ion beam. The mass analyzing lens 22 adjusts a focusing position of the ion beam passing through the mass analyzing slit 23 in a beam traveling direction (z-direction), and adjusts a mass resolution $M/dM$ of the mass analyzing unit 20. The mass analyzing lens 22 is not an essential component, and the mass analyzing unit 20 need not have the mass analyzing lens 22.

The mass analyzing slit 23 is disposed downstream of the mass analyzing lens 22, and is disposed at a position away from the mass analyzing lens 22. The mass analyzing slit 23 is configured so that a beam deflection direction (x-direction) by the mass analyzing magnet 21 is a slit width direction, and has an opening 23a that is relatively short in the x-direction and relatively long in the y-direction.

The mass analyzing slit 23 may be configured so that the slit width is variable for adjusting the mass resolution. The mass analyzing slit 23 may be configured by two blockade bodies that are movable in the slit width direction, and may be configured so that the slit width is adjustable by changing an interval between the two blockade bodies. The mass analyzing slit 23 may be configured so that the slit width is variable by selecting any one of a plurality of slits having different slit widths.

The beam park device 24 is configured to cause the ion beam to temporarily retreat from the beamline A and to temporarily block the ion beam directed to the implantation processing chamber 16 (or the wafer W) located downstream. The beam park device 24 can be disposed at any desired position in an intermediate portion of the beamline A. For example, the beam park device 24 can be disposed between the mass analyzing lens 22 and the mass analyzing slit 23. A prescribed distance is required between the mass analyzing lens 22 and the mass analyzing slit 23. Accordingly, the beam park device 24 is disposed between both of them. In this manner, a length of the beamline A can be shortened, compared to a case where the beam park device 24 is disposed at another position. Therefore, the whole ion implanter 10 can be reduced in size.

The beam park device 24 includes a pair of park electrodes 25 (25a and 25b) and a beam dump 26. The pair of park electrodes 25a and 25b faces each other across the beamline A, and faces in a direction (y-direction) perpendicular to the beam deflection direction (x-direction) of the mass analyzing magnet 21. The beam dump 26 is disposed on the downstream side of the beamline A than the park electrodes 25a and 25b, and is disposed away from the beamline A in a facing direction of the park electrodes 25a and 25b.

The first park electrode 25a is disposed on an upper side of the beamline A in a direction of gravity, and the second park electrode 25b is disposed on a lower side of the beamline A in the direction of gravity. The beam dump 26 is disposed at a position away to the lower side of the beamline A in the direction of gravity, and is disposed on the lower side of the opening 23a of the mass analyzing slit 23 in the direction of gravity. For example, the beam dump 26 is configured to include a portion of the mass analyzing slit 23 where the opening 23a is not formed. The beam dump 26 may be configured to be separate from the mass analyzing slit 23.

The beam park device 24 deflects the ion beam by using an electric field applied between the pair of park electrodes 25a and 25b, and causes the ion beam to retreat from the beamline A. For example, a negative voltage is applied to the second park electrode 25b, based on a potential of the first park electrode 25a. In this manner, the ion beam is deflected downward from the beamline A in the direction of gravity, and is incident into the beam dump 26. In FIG. 2, a trajectory of the ion beam directed toward the beam dump 26 is indicated by a dashed line. The beam park device 24 causes the ion beam to pass toward the downstream side along the beamline A by setting the pair of park electrodes 25a and 25b to have the same potential. The beam park device 24 is configured to be operable by switching between a first mode in which the ion beam passes to the downstream side and a second mode in which the ion beam is incident into the beam dump 26.

An injector Faraday cup 28 is disposed downstream of the mass analyzing slit 23. The injector Faraday cup 28 is configured to be movable into and out of the beamline A by an operation of an injector driving unit 29. The injector driving unit 29 moves the injector Faraday cup 28 in a direction (for example, the y-direction) perpendicular to an extending direction of the beamline A. Ina case where the injector Faraday cup 28 is disposed on the beamline A as illustrated by a dashed line in FIG. 2, the injector Faraday cup 28 blocks the ion beam directed toward the downstream side. On the other hand, as illustrated by a solid line in FIG. 2, in a case where the injector Faraday cup 28 retreat from the beamline A, the blocking of the ion beam directed toward the downstream side is released.

The injector Faraday cup 28 is configured to measure a beam current of the ion beam subjected to mass analyzing by the mass analyzing unit 20. The injector Faraday cup 28 can measure a mass analyzing spectrum of the ion beam by measuring the beam current while changing the strength of the magnetic field of the mass analyzing magnet 21. The mass resolution of the mass analyzing unit 20 can be calculated using the measured mass analyzing spectrum.

The beam shaping unit 30 includes a focusing/defocusing device such as a focusing/defocusing quadrupole lens (Q-lens), and is configured to shape the ion beam having passed through the mass analyzing unit 20 to have a desired cross-sectional shape. For example, the beam shaping unit 30 is configured to include an electric field type three-stage quadrupole lens (also referred to as a triplet Q-lens), which has three quadrupole lenses 30a, 30b, and 30c. The beam shaping unit 30 adopts the three lens devices 30a to 30c. Accordingly, the beam shaping unit 30 can adjust the ion beam to converge or diverge independently in the x-direction and the y-direction, respectively. The beam shaping unit 30 may include a magnetic field type lens device, or may include a lens device that shapes the beam by using both an electric field and a magnetic field.

The beam scanning unit 32 is a beam deflection device configured to provide reciprocating scanning using the beam and to perform scanning using the shaped ion beam in the x-direction. The beam scanning unit 32 has a scanning electrode pair facing in a beam scanning direction (x-direction). The scanning electrode pair is connected to a variable voltage power supply (not illustrated), and a voltage applied between the scanning electrode pair is periodically changed. In this manner, an electric field generated between the electrodes is changed so that the ion beam is deflected at various angles. As a result, a whole scanning range is scanned with the ion beam in the x-direction. In FIG. 1, the scanning direction and the scanning range of the ion beam are indicated by an arrow X, and a plurality of trajectories of the ion beam in the scanning range are indicated by a one dot chain line.

The beam parallelizing unit 34 is configured so that the traveling direction of the ion beam used for the scanning become parallel to the trajectory of the designed beamline A. The beam parallelizing unit 34 has a plurality of arc-shaped parallelizing lens electrodes in which an ion beam passing slit is disposed in a central portion in the y-direction. The parallelizing lens electrode is connected to a high-voltage power supply (not illustrated), and applies an electric field generated by voltage application to the ion beam so that the traveling directions of the ion beam are parallelized. The beam parallelizing unit 34 may be replaced with another beam parallelizing device, and the beam parallelizing device may be configured to serve as a magnet device using a magnetic field.

An acceleration/deceleration (A/D) column (not illustrated) for accelerating or decelerating the ion beam may be disposed downstream of the beam parallelizing unit 34.

The angular energy filter (AEF) 36 is configured to analyze energy of the ion beam, to deflect ions having necessary energy downward, and to guide the ions to the implantation processing chamber 16. The angular energy filter 36 has an AEF electrode pair for electric field deflection. The AEF electrode pair is connected to a high-voltage power supply (not illustrated). In FIG. 2, the ion beam is deflected downward by applying a positive voltage to the upper AEF electrode and applying a negative voltage to the lower AEF electrode. The angular energy filter 36 may be configured to include a magnet device for magnetic field deflection, or may be configured to include a combination between the AEF electrode pair for electric field deflection and the magnet device for magnetic field deflection.

In this way, the beamline device 14 supplies the ion beam to be used for irradiating the wafer W to the implantation processing chamber 16.

The implantation processing chamber 16 includes an energy slit 38, a plasma shower device 40, side cups 42 (42L and 42R), a profiler cup 44, and a beam stopper 46, in order from the upstream side of the beamline A. As illustrated in FIG. 2, the implantation processing chamber 16 includes a platen driving device 50 that holds one or more wafers W.

The energy slit 38 is disposed on the downstream side of the angular energy filter 36, and analyzes the energy of the ion beam incident into the wafer W together with the angular energy filter 36. The energy slit 38 is an energy defining slit (EDS) configured to include a slit that is horizontally long in the beam scanning direction (x-direction). The energy slit 38 causes the ion beam having a desired energy value or a desired energy range to pass toward the wafer W, and blocks the other ion beams.

The plasma shower device 40 is located on the downstream side of the energy slit 38. The plasma shower device 40 supplies low-energy electrons to the ion beam and a surface of the wafer W (wafer processing surface) in accordance with a beam current amount of the ion beam, and suppresses an accumulation of positive charges on the wafer processing surface which are induced by ion implantation. For example, the plasma shower device 40 includes a shower tube through which the ion beam passes, and a plasma generating device that supplies electrons into the shower tube.

The side cups 42 (42L and 42R) are configured to measure the beam current of the ion beam during a process of implanting the ions into the wafer W. As illustrated in FIG. 2, the side cups 42L and 42R are disposed to be shifted to the left and right (x-direction) with respect to the wafer W disposed on the beamline A, and are disposed at a position where the side cups 42L and 42R do not block the ion beam directed toward the wafer W during the ion implantation. The ion beam is used for scanning in the x-direction beyond a range where the wafer W is located. Accordingly, a portion of the beam for the scanning is incident into the side cups 42L and 42R even during the ion implantation. In this manner, the beam current amount during the ion implantation process is measured by the side cups 42L and 42R.

The profiler cup 44 is configured to measure the beam current on the wafer processing surface. The profiler cup 44 is configured to be movable by an operation of the profiler driving device 45, is retreated from an implantation position where the wafer W is located during the ion implantation, and is inserted into the implantation position when the wafer W is not located at the implantation position. The profiler cup 44 measures the beam current while moving in the x-direction. In this manner, the profiler cup 44 can measure the beam current over the whole beam scanning range in the x-direction. In the profiler cup 44, a plurality of Faraday cups may be aligned in the x-direction to be formed in an array shape so that the beam currents can be simultaneously measured at a plurality of positions in the beam scanning direction (x-direction).

The profiler cup 44 includes a first profiler cup 44a and a second profiler cup 44b. The first profiler cup 44a is a first Faraday cup used during a preparation process performed before the implantation process, and is a Faraday cup for normal measurement. The second profiler cup 44b is a second Faraday cup used during a calibration process, and is a Faraday cup for calibration which is not normally used. A blockade member 43 is disposed in front of the second profiler cup 44b, and is configured so that the ion beam cannot be incident into the second profiler cup 44b during the implantation process and the preparation process. The blockade member 43 may not be a dedicated member for blocking the ion beam not to be incident into the second profiler cup 44b. Any desired structure disposed inside the implantation processing chamber 16 may function as the blockade member 43. For example, at least a portion of any desired structure disposed inside the implantation processing chamber 16 may be the blockade member 43.

The second profiler cup 44b may be configured to have higher measurement accuracy than that of the first profiler cup 44a. For example, the second profiler cup 44b may be configured so that machining accuracy of a component of the second profiler cup 44b is higher than that of the first profiler cup 44a, and may be fabricated to decrease a tolerance of a size of an opening into which the ion beam to be the measurement target is incident. The second profiler cup 44b may be configured so that the measurement accuracy when in use is degraded more slowly than that of the first profiler cup 44a. For example, the second profiler cup 44b may be configured so that a component of the second profiler cup 44b has higher wear resistance than that of the first profiler cup 44a.

The first profiler cup 44a and the second profiler cup 44b are configured to be movable independently of each other. The first profiler cup 44a is configured to be movable in the x-direction along a first drive shaft 45a of the profiler driving device 45. The second profiler cup 44b is configured to be movable in the x-direction along a second drive shaft 45b of the profiler driving device 45. The first profiler cup 44a and the second profiler cup 44b are configured to be movable in parallel with each other.

At least one of the side cups 42 and the profiler cup 44 may include a single Faraday cup for measuring a beam current amount, or may include an angle measurement device for measuring angle information of the beam. For example, the angle measurement device includes a slit and a plurality of current detectors disposed away from the slit in the beam traveling direction (z-direction). For example, the angle measurement device can measure an angle component of the beam in the slit width direction by causing the plurality of current detectors aligned in the slit width direction to measure the beam having passed through the slit. At least one of the side cups 42 and the profiler cup 44 may include a first angle measurement device capable of measuring angle information in the x-direction and a second angle measurement device capable of measuring angle information in the y-direction.

The platen driving device 50 includes a wafer holding device 52, a reciprocating mechanism 54, a twist angle adjusting mechanism 56, and a tilt angle adjusting mechanism 58. The wafer holding device 52 includes an electrostatic chuck for holding the wafer W. The reciprocating mechanism 54 causes the wafer holding device 52 to reciprocate in a reciprocating direction (y-direction) perpendicular to the beam scanning direction (x-direction). In this manner, the wafer held by the wafer holding device 52 is caused to reciprocate in the reciprocating direction (y-direction). In FIG. 2, a reciprocating movement of the wafer W is indicated by an arrow Y.

The twist angle adjusting mechanism 56 adjusts a rotation angle of the wafer W. The twist angle adjusting mechanism 56 rotates the wafer W around a normal line of the wafer processing surface as a rotation center axis. In this manner, the twist angle adjusting mechanism 56 adjusts a twist angle between an alignment mark disposed on an outer peripheral portion of the wafer and a reference position. Here, the alignment mark of the wafer means a notch or an orientation flat disposed on the outer peripheral portion of the wafer, and means a mark that serves as a reference for a crystal axis direction of the wafer or an angular position in a circumferential direction of the wafer. The twist angle adjusting mechanism 56 is disposed between the wafer holding device 52 and the reciprocating mechanism 54, and is caused to reciprocate together with the wafer holding device 52.

The tilt angle adjusting mechanism 58 adjusts tilting of the wafer W, and adjusts a tilt angle between the traveling direction of the ion beam directed toward the wafer processing surface and the normal line of the wafer processing surface. In the present embodiment, out of the tilt angles of the wafer W, an angle with respect to which the axis in the x-direction is a rotation center axis is adjusted as the tilt angle. The tilt angle adjusting mechanism 58 is disposed between the reciprocating mechanism 54 and an inner wall of the implantation processing chamber 16, and rotates the whole platen driving device 50 including the reciprocating mechanism 54 in an R-direction. In this manner, the tilt angle adjusting mechanism 58 is configured to adjust the tilt angle of the wafer W.

The platen driving device 50 holds the wafer W so that the wafer W is movable between an implantation position where the wafer W is irradiated with the ion beam and a transfer position where the wafer W is loaded or unloaded between the platen driving device 50 and the wafer transfer device 18. FIG. 2 illustrates a state where the wafer W is located at the implantation position, and the platen driving device 50 holds the wafer W so that the beamline A and the wafer W intersect each other. The transfer position of the wafer W corresponds to a position of the wafer holding device 52 when the wafer W is loaded or unloaded through a transfer port 48 by a transfer mechanism or a transfer robot disposed in the wafer transfer device 18.

The beam stopper 46 is disposed on the most downstream side of the beamline A, and is mounted on the inner wall of the implantation processing chamber 16, for example. In a case where the wafer W does not exist on the beamline A, the ion beam is incident into the beam stopper 46. The beam stopper 46 is located close to the transfer port 48 that connects the implantation processing chamber 16 and the wafer transfer device 18 to each other, and is disposed at a position vertically below the transfer port 48.

The beam stopper 46 has a plurality of tuning cups 47 (47a, 47b, 47c, and 47d). The plurality of tuning cups 47 are Faraday cups configured to measure the beam current of the ion beam incident into the beam stopper 46. The plurality of tuning cups 47 are disposed with intervals in the x-direction. For example, the plurality of tuning cups 47 are used for easily measuring the beam current at the implantation position without using the profiler cup 44.

The ion implanter 10 further includes a control device 60. The control device 60 controls an overall operation of the ion implanter 10. The control device 60 is realized in hardware by elements such as a CPU and a memory of a computer or a mechanical device, and in software by a computer program or the like. Various functions provided by the control device 60 can be realized by cooperation between the hardware and the software.

Figure 3:
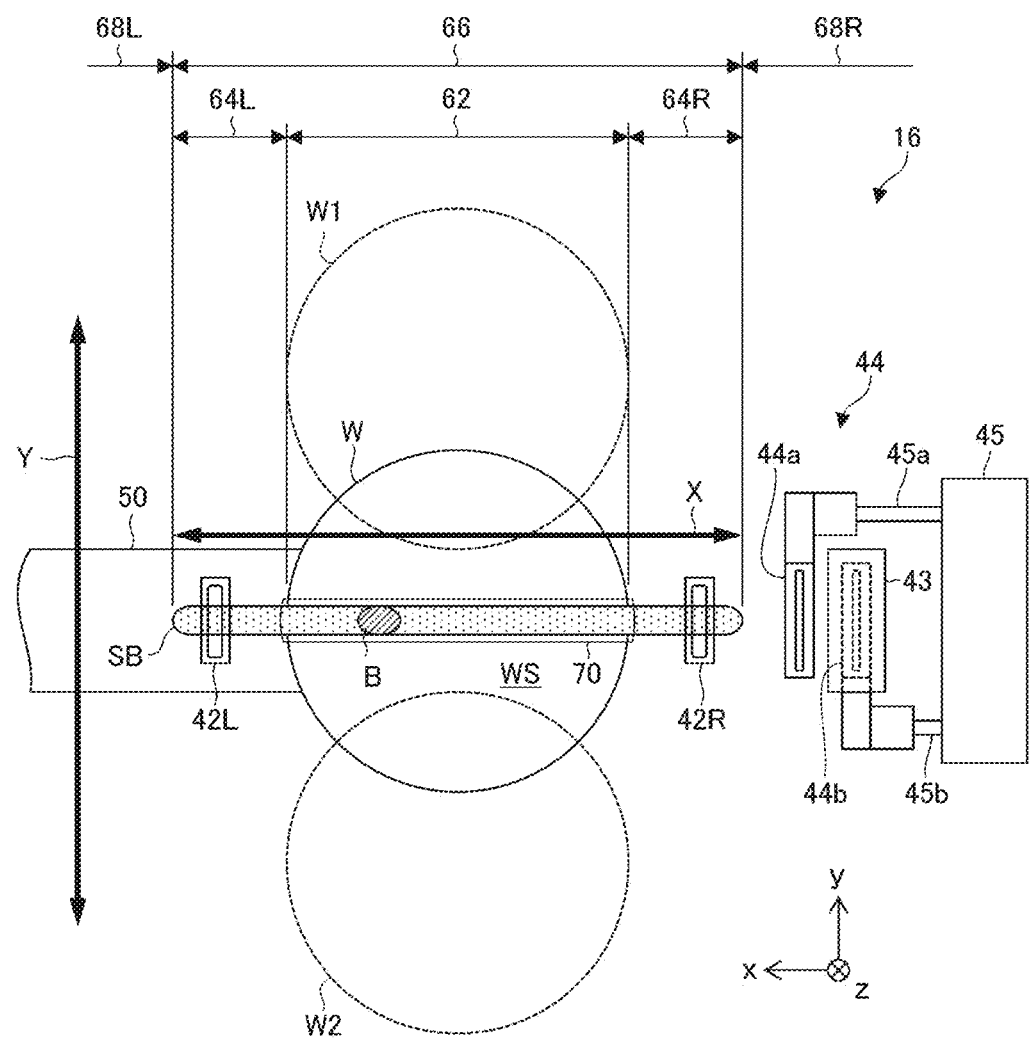
FIG. 3 is a front view illustrating a schematic configuration inside an implantation processing chamber in FIG. 1.

FIG. 3 is a front view illustrating a schematic configuration inside the implantation processing chamber 16 in FIG. 1, and illustrates a processing surface WS of the wafer W to be irradiated with an ion beam B when viewed from the front. The ion beam B is used for reciprocating scanning in the x-direction as indicated by an arrow X, and is incident into the wafer W, as a scan beam SB used for reciprocating scanning in the x-direction. The wafer W is held by the platen driving device 50, and is caused to reciprocate in the y-direction as indicated by an arrow Y. In FIG. 3, with regard to the wafer W that reciprocates in the y-direction by the operation of the platen driving device 50, the wafer W1 located at an uppermost position and the wafer W2 located at a lowermost position are illustrated by a dashed lines. In addition, an implantation position 70 at which the ions are implanted when the scan beam SB is incident into the wafer processing surface WS during the implantation process is illustrated by a thin solid line.

The ion beam B is used for reciprocating scanning over an irradiation range 66 including an implantation range 62 where the wafer W is located and monitor ranges 64L and 64R outside the implantation range 62. The left and right side cups 42L and 42R are respectively disposed in the left and right monitor ranges 64L and 64R. The left and right side cups 42L, 42R can measure the ion beam B used for over-scanning the monitor ranges 64L and 64R during the implantation process. The implantation position 70 in the x-direction coincides with the implantation range 62. The implantation position 70 in the y-direction coincides with a position of the ion beam B or the scan beam SB in the y-direction. The implantation position 70 in the z-direction coincides with a position of the wafer processing surface WS in the z-direction.

The profiler cup 44 is retreated to a non-irradiation range 68R outside the irradiation range 66 during the implantation process. In the illustrated configuration, the profiler driving device 45 is disposed on the right side. During the implantation process, the first profiler cup 44a and the second profiler cup 44b are retreated to the non-irradiation range 68R on the right side. In a configuration in which the profiler driving device 45 is disposed on the left side, during the implantation process, the first profiler cup 44a and the second profiler cup 44b may be retreated to a non-irradiation range 68L on the left side.

The blockade member 43 is disposed in the non-irradiation range 68R on the right side, and is disposed at a position overlapping the second profiler cup 44b when viewed in the beam traveling direction (z-direction). In other words, a position of the blockade member 43 in the directions (x-direction and y-direction) perpendicular to the beam traveling direction at least partially coincides with a position of the second profiler cup 44b in the directions (x-direction and y-direction) perpendicular to the beam traveling direction. The blockade member 43 is disposed to block the ion beam B directed toward the second profiler cup 44b during a process other than the calibration process. The blockade member 43 is provided in this way. Accordingly, the ion beam B is not incident into the second profiler cup 44b during the process other than the calibration process, thereby preventing the second profiler cup 44b from being worn out or getting dirty due to the ion beam B incident into the second profiler cup 44b.

Next, an operation of the ion implanter 10 will be described. The control device 60 controls the operation of the ion implanter 10 to perform the implantation process, the preparation process, and the calibration process.

Figure 4:
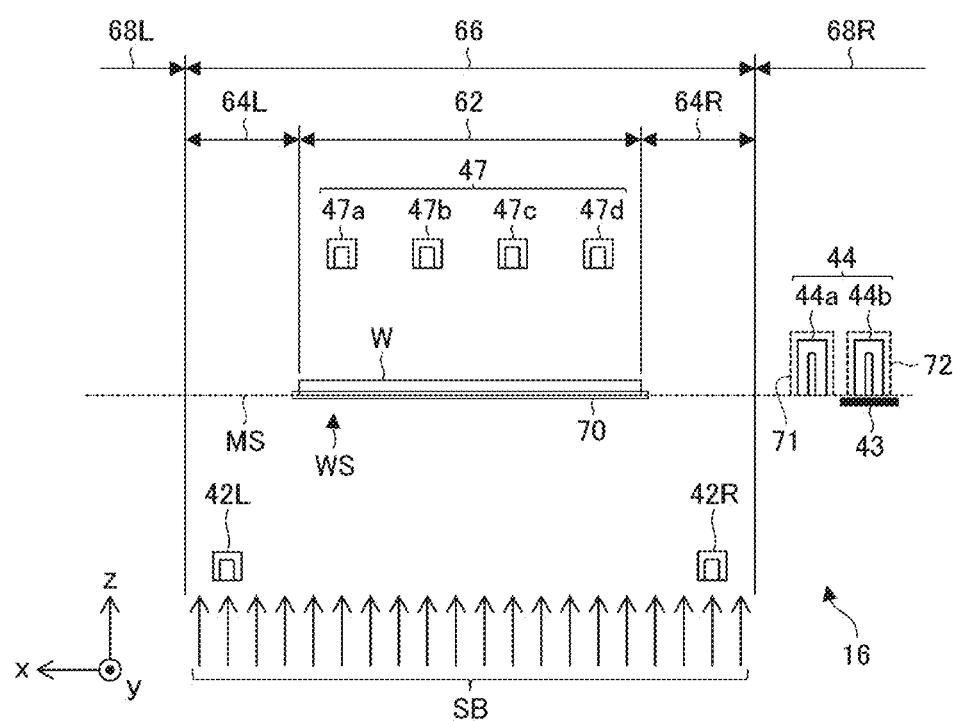
FIG. 4 is a top view schematically illustrating a configuration inside the implantation processing chamber during an implantation process.

FIG. 4 is a top view schematically illustrating a configuration inside the implantation processing chamber 16 during the implantation process. FIG. 4 corresponds to disposition of the wafer W and the profiler cup 44 which are illustrated in FIG. 3. During the implantation process, the wafer W is disposed in the implantation range 62, and the profiler cup 44 is disposed in the non-irradiation range 68. The first profiler cup 44a is disposed at a first retreat position 71 illustrated by a dashed line, and the second profiler cup 44b is disposed at a second retreat position 72 illustrated by a dashed line. The first retreat position 71 and the second retreat position 72 are located in the non-irradiation range 68R on the right side. In the illustrated example, the first retreat position 71 and the second retreat position 72 are adjacent to each other in the x-direction. The first retreat position 71 is located on the left side of the second retreat position 72, and is located closer to the implantation position 70 than the second retreat position 72. The blockade member 43 is disposed at the second retreat position 72. The blockade member 43 is disposed to close an entrance of the second profiler cup 44b located at the second retreat position 72.

During the implantation process in FIG. 4, the beam current can be always measured using the side cups 42L and 42R. On the other hand, during the implantation process, the beam current cannot always be measured and can be only intermittently measured using the profiler cup 44 or the tuning cup 47. Therefore, during the implantation process, a dose of the ions implanted into the wafer processing surface WS is controlled, based on a beam current measurement value measured by the side cups 42L and 42R. In a case where the beam current measurement value measured by the side cups 42L and 42R is changed during the implantation process, a dose distribution on the wafer processing surface WS is adjusted by changing a speed of the reciprocating movement of the wafer W in the y-direction. For example, in a case where an in-plane uniform dose distribution needs to be realized on the wafer processing surface WS, the wafer W is caused to reciprocate at a speed proportional to a beam current measurement value monitored by the side cups 42L and 42R. Specifically, in a case where the beam current measurement value to be monitored increases, the reciprocating movement of the wafer W is made fast, and in a case where the beam current measurement value to be monitored decreases, the reciprocating movement of the wafer W is made slow. In this manner, it is possible to prevent the dose distribution on the wafer processing surface from varying due to fluctuations in the beam current of the scan beam SB.

During the implantation process, the control device 60 acquires the beam current measurement value measured by the side cups 42L and 42R, and controls an operation of the platen driving device 50, based on the acquired beam current measurement value. The control device 60 generates a speed command for the platen driving device 50 so that the wafer W reciprocates at a speed proportional to the beam current measurement value acquired from the side cups 42L and 42R, and controls the operation of the platen driving device 50.

Figure 5:
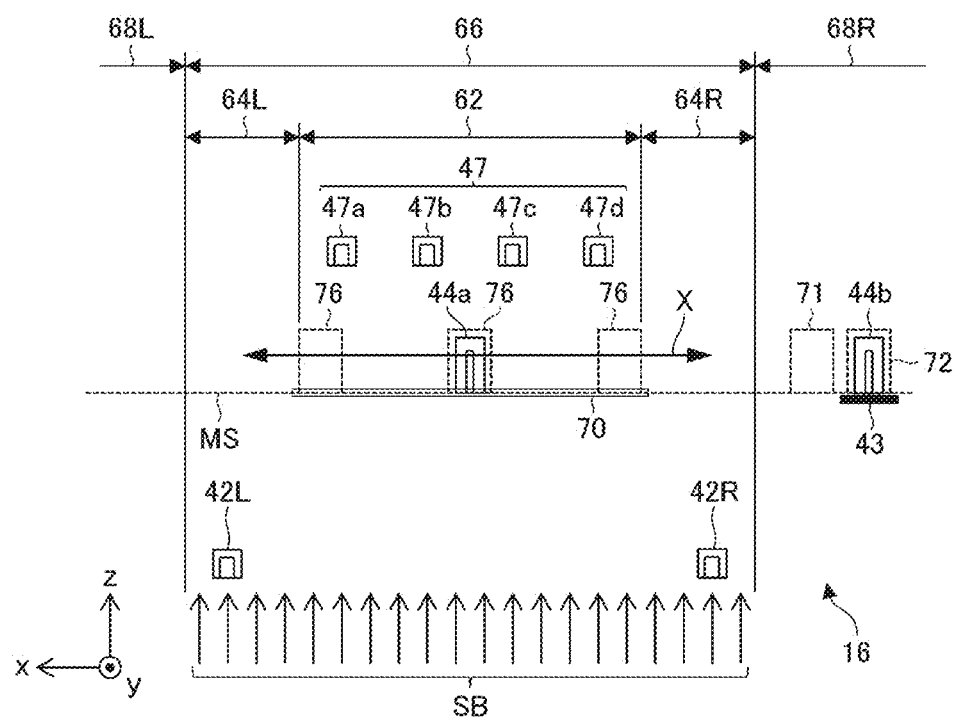
FIG. 5 is a top view schematically illustrating a configuration inside the implantation processing chamber during a preparation process.

FIG. 5 is a top view schematically illustrating a configuration inside the implantation processing chamber 16 during the preparation process. The preparation process is performed before the implantation process, and the beam currents of the scan beam SB in the implantation range 62 and the monitor ranges 64L and 64R are measured. The beam current in the implantation range 62 can be measured using the first profiler cup 44a or the tuning cup 47. The beam currents in the monitor ranges 64L and 64R can be measured using the side cups 42L and 42R, in the same manner as in the implantation process.

During the preparation process, the first profiler cup 44a moves in the x-direction from the first retreat position 71 to a plurality of first measurement positions 76. The plurality of first measurement positions 76 overlap the implantation position 70 when viewed in the beam traveling direction, and are located on a plane (also referred to as a measurement surface MS) that coincides with the wafer processing surface WS during the implantation process. In other words, a position of the plurality of first measurement positions 76 in the directions (x-direction and y-direction) perpendicular to the beam traveling direction coincides with a position of the implantation position 70 in the directions (x-direction and y-direction) perpendicular to the beam traveling direction. Therefore, the first profiler cup 44a can measure the beam current at the same position as the implantation position 70 where the ions are implanted into the wafer W during the implantation process. The first profiler cup 44a measures the beam current while moving in the x-direction. In this manner, the first profiler cup 44a can also measure a beam current density distribution in the x-direction at the implantation position 70 (or the measurement surface MS).

The plurality of tuning cups 47 overlap the implantation position 70 when viewed in the beam traveling direction, but are away from the implantation position 70 (or the measurement surface MS) to the downstream side in the beam traveling direction. The plurality of tuning cups 47 do not need to be moved between a retreat position and a measurement position unlike the first profiler cup 44a. Therefore, compared to the first profiler cup 44a, the beam current in the implantation range 62 can be more easily measured.

During the preparation process, the control device 60 acquires the beam current measurement values measured by various Faraday cups disposed inside the implantation processing chamber 16. Specifically, the beam current measurement values measured by the side cups 42L and 42R, the first profiler cup 44a, and the plurality of tuning cups 47 are respectively acquired. The control device 60 stores a ratio between the acquired beam current measurement values so that the beam current value at the implantation position 70 (that is, the wafer processing surface WS) can be calculated from the beam current measurement value measured by the side cups 42L and 42R during the implantation process. Normally, the ratio between the beam current measurement values measured by various Faraday cups depends on settings of a beam optical system of the beamline device 14. Even when the beam current of the ion beam B extracted from the ion generator 12 slightly fluctuates, the ratio between the beam current measurement values is substantially constant. That is, when the settings of the beam optical system are determined during the preparation process, the ratio between the beam current measurement values during the subsequent implantation process is not changed. Therefore, when the ratio between the beam current measurement values is stored during the preparation process, based on the ratio and the beam current measurement values measured by the side cups 42L and 42R, it is possible to calculate the beam current value at the implantation position 70 (that is, the wafer processing surface WS) where the ions are implanted into the wafer W during the implantation process.

The second profiler cup 44b is not used during the implantation process in FIG. 4 and the preparation process in FIG. 5. During the implantation process and the preparation process, the second profiler cup 44b is disposed as it is at the second retreat position 72 where the incidence of the scan beam SB is blocked by the blockade member 43. The second profiler cup 44b is used only during the calibration process for calibrating the beam current measurement value of the first profiler cup 44a.

Figure 6:
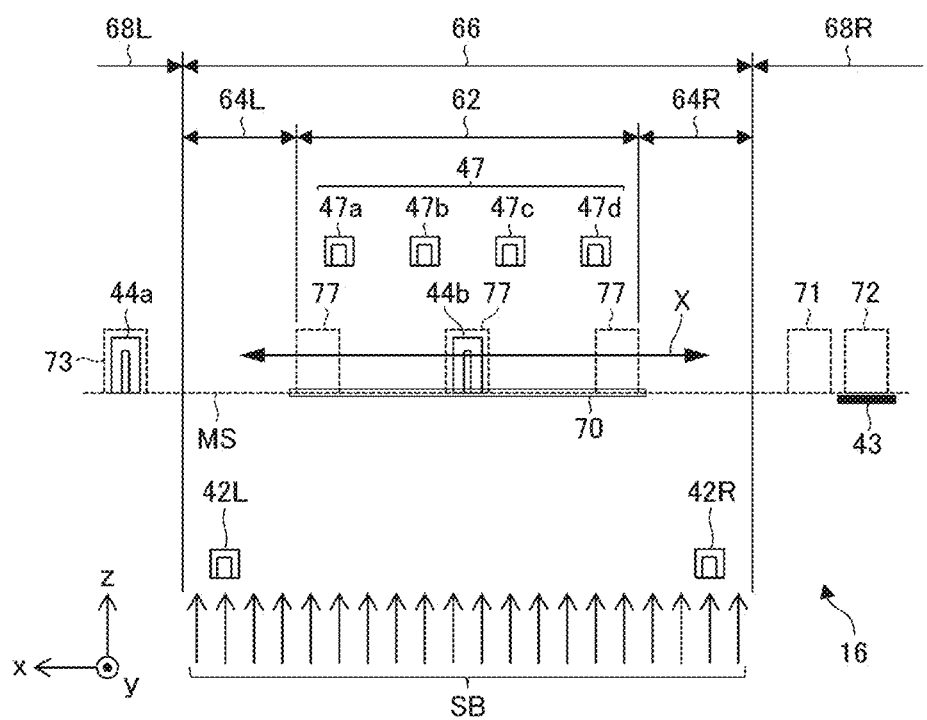
FIG. 6 is a top view schematically illustrating a configuration inside the implantation processing chamber during a calibration process.

FIG. 6 is a top view schematically illustrating a configuration inside the implantation processing chamber 16 during the calibration process. During the calibration process, the second profiler cup 44b moves in the x-direction from the second retreat position 72 to a plurality of second measurement positions 77. The plurality of second measurement positions 77 overlap the implantation position 70 when viewed in the beam traveling direction. In other words, a position of the plurality of second measurement positions 77 in the directions (x-direction and y-direction) perpendicular to the beam traveling direction coincides with a position of the implantation position 70 in the directions (x-direction and y-direction) perpendicular to the beam traveling direction. The plurality of second measurement positions 77 are located at the implantation position 70 (or the measurement surface MS), and the plurality of second measurement positions 77 are equivalent to the plurality of first measurement positions 76 in the beam traveling direction. Accordingly, each of the plurality of second measurement positions 77 at least partially coincides with each of the plurality of first measurement positions 76. The second profiler cup 44b can measure the beam current at the same position as that of the wafer processing surface WS during the implantation process, and can measure the beam current at the same position as that of the first profiler cup 44a. The second profiler cup 44b may measure the beam current while moving in the x-direction so as to measure the beam current density distribution in the x-direction at the implantation position 70 (or the measurement surface MS).

During the calibration process, the first profiler cup 44a may be disposed at a third retreat position 73 different from the first retreat position 71. The third retreat position 73 is located in the non-irradiation range 68L on the left side. The third retreat position 73 is located on a side opposite to the first retreat position 71 and the second retreat position 72 across the implantation range 62. The first profiler cup 44a is retreated to the third retreat position 73. In this manner, the second profiler cup 44b can be moved from the second retreat position 72 to the plurality of second measurement positions 77.

During the calibration process, each of the first profiler cup 44a and the second profiler cup 44b may be independently moved, or may be simultaneously moved. In a case where each of the first profiler cup 44a and the second profiler cup 44b is independently moved, first, the first profiler cup 44a is moved to at least one of the plurality of first measurement positions 76, and the beam current measurement value at the implantation position 70 is measured by the first profiler cup 44a. Subsequently, the second profiler cup 44b is moved to at least one of the plurality of second measurement positions 77, and the beam current measurement value at the implantation position 70 is measured by the second profiler cup 44b. In a case where both the first profiler cup 44a and the second profiler cup 44b are simultaneously moved, the first profiler cup 44a is moved in the x-direction from the first retreat position 71 toward the third retreat position 73, and the beam current measurement value at the plurality of first measurement positions 76 is measured by the first profiler cup 44a. At this time, the second profiler cup 44b is moved from the second retreat position 72 to at least one of the plurality of second measurement positions 77, and the beam current measurement value of at least one of the plurality of second measurement positions 77 is measured by the second profiler cup 44b. The profiler cup 44 is operated in this way. Accordingly, for the scan beam SB under the same condition, the beam current measurement value to be measured at the same measurement point in the implantation position 70 can be acquired using each of the first profiler cup 44a and the second profiler cup 44b.

Based on the beam current measurement values measured by the first profiler cup 44a and the second profiler cup 44b, the control device 60 determines a calibration parameter for calibrating the beam current measurement value measured by the first profiler cup 44a. In a case where a first beam current measurement value measured by the first profiler cup 44a during the calibration process is set to $I_1$ and a second beam current measurement value measured by the second profiler cup 44b during the calibration process is set to $I_2$, a calibration parameter k can be expressed by a ratio $I_2/I_1$ between the first beam current measurement value $I_1$ and the second beam current measurement value $I_2$ (that is, $k=I_2/I_1$). The calibration parameter k is determined. In this manner, based on the beam current measurement value $I_1$ measured by the first profiler cup 44a during the preparation process, the calibrated beam current value $I_2$ with reference to the second profiler cup 44b can be calculated using Equation of $I_2=kI_1$. During the implantation process, a dose on the wafer processing surface WS is controlled, based on a beam current value $kI_1$ calibrated using the calibration parameter k.

Subsequently, a timing for performing the calibration process will be described. The calibration process is performed when an unused ion implanter 10 starts to be operated and when maintenance work such as cleaning and replacement of the first profiler cup 44a is carried out. When the ion implanter 10 starts to be operated, the calibration parameter k is not determined yet. Therefore, the calibration process is performed when the ion implanter 10 starts to be operated. In this manner, an initial value $k_{A,\,0}$ of the calibration parameter is determined. When the maintenance work is carried out for the first profiler cup 44a, the calibration parameter k for the first profiler cup 44a after the maintenance work is not determined yet. Therefore, the calibration process is carried out after the maintenance work. In this manner, initial values $k_{A,\,i}$ (i=1, 2, 3, . . . ) of the calibration parameter after the maintenance work are determined. Here, the subscript i is a number for identifying each of the maintenance works, and is the number of times at which the maintenance works are carried out, for example. For example, the initial value $k_{A,\,1}$ is determined after the first maintenance work, the initial value $k_{A,\,2}$ is determined after the second maintenance work, and the initial value $k_{A,\,3}$ is determined after the third maintenance work. The control device 60 stores each of the initial values $k_{A,\,i}$ (i=0, 1, 2, 3, . . . ) of the calibration parameter determined in this way. Together with the initial values $k_{A,\,i}$ of the calibration parameter, the control device 60 may store information indicating the dates and times of determining the initial values $k_{A,\,i}$ and contents of the maintenance works carried out before the calibration processes.

The calibration process may be performed at any desired timing other than when the operation starts or when the maintenance work is carried out. For example, the calibration process may be periodically performed when the ion implanter 10 is operated. Specifically, the calibration process may be performed in a case where a predetermined time elapses from the previous calibration process, or in a case where an integrated value of the beam current measurement values measured by the first profiler cup 44a after the previous calibration process exceeds a predetermined threshold value. In this these calibration processes, update values $k_{B,\,j}$ (j=1, 2, 3, . . . ) of the calibration parameter are determined. The updated values $k_{B,\,j}$ of the calibration parameter are stored separately from the initial values $k_{A,i}$ of the calibration parameter. Here, the subscript j is a number for identifying each of the calibration processes, and is the number of times at which the calibration processes are performed, for example. For example, a first update value $k_{B,1}$ is determined during the first calibration process after the initial value $k_{A,i}$ of the calibration parameter is determined, a second update value $k_{B,2}$ is determined during the second calibration process, and a third update value $k_{B,3}$ is determined during the third calibration process. During the implantation process after the calibration parameter is updated, a dose on the wafer processing surface WS is controlled, based on the beam current value $k_{B,j}I_1$ calibrated using the updated value $k_{B,j}$ of the calibration parameter. Specifically, the updated value $k_{B,j}$ of the calibration parameter determined during the latest calibration process is used. The control device 60 stores each of the updated values $k_{B,j}$ (j=1, 2, 3, . . . ) of the calibration parameter determined in this way. Together with the update values $k_{B,j}$ of the calibration parameter, the control device 60 may store information indicating the dates and times of performing the calibration processes and events that trigger the calibration processes to be performed.

The control device 60 may update the calibration parameter only in a case where a value of the calibration parameter determined during the calibration process satisfies a predetermined condition. For example, the value of the calibration parameter may be updated in a case where a difference between a value k of the calibration parameter newly determined during the calibration process and the initial value $k_{A,i}$ of the calibration parameter falls within a predetermined range. On the other hand, in a case where the difference between the value k of the calibration parameter newly determined during the calibration process and the initial value $k_{A,i}$ of the calibration parameter does not fall within the predetermined range, an alert may be output without updating the value of the calibration parameter. The reason is as follows. In a case where a change amount of the calibration parameter does not fall within the predetermined range, there is a high possibility that the measurement system may be abnormal to some extent. The control device 60 may prompt a user to clean or replace the first profiler cup 44a, based on the difference between the value k of the calibration parameter newly determined during the calibration process and the initial values $k_{A,i}$ of the calibration parameter. The initial value $k_{A,i}$ of the calibration parameter serving as a comparison target may be the initial value of the latest calibration parameter. For example, in a case where the maintenance work is carried out three times (that is, i=3), an initial value $k_{A,3}$ of the latest calibration parameter may be set as the comparison target. The initial values $k_{A,i}$ of the calibration parameter serving as the comparison target may not be the initial value of the latest calibration parameter. For example, in the case where the maintenance works are carried out three times (that is, i=3), the initial value $k_{A,0}$ of the calibration parameter when the operation starts may be set as the comparison target, or the initial value $k_{A,1}$ or $k_{A,2}$ of the calibration parameter after the first or second maintenance work is carried out may be set as the comparison target. Any two or more of the plurality of the initial values $k_{A,i}$ (for example, i=0, 1, 2, 3) of the calibration parameter may be set as the comparison target.

During the calibration process in an initial state for determining the initial value $k_{A,i}$ of the calibration parameter, the control device 60 may acquire the beam current measurement value measured by a "third Faraday cup" such as the side cups 42 and the tuning cup 47. The side cups 42 and the tuning cup 47 can be referred to as the third Faraday cups in that both of these are different from the first Faraday cup (first profiler cup 44a) for normal measurement and the second Faraday cup (second profiler cup 44b) for calibration measurement. The side cups 42 can be referred to as the third Faraday cup that measures the beam current at a position which does not overlap the implantation position 70 when viewed in the beam traveling direction. On the other hand, the tuning cup 47 can be referred to as the third Faraday cup that measures the beam current at a position which overlaps the implantation position 70 when viewed in the beam traveling direction.

The control device 60 acquires the beam current measurement values of the first Faraday cup and the third Faraday cup during the calibration process in the initial state, and stores a ratio between the beam current measurement values as a initial value. For example, the control device 60 may store the initial value of the ratio between the beam current measurement values respectively measured by the first profiler cup 44a and the side cups 42, or may store the initial value of the ratio between the beam current measurement values respectively measured by the first profiler cup 44a and the tuning cup 47.

During the calibration process in the initial state, the control device 60 may acquire the ratio between the beam current measurement values of the plurality of third Faraday cups, and may store the ratio between the current measurement values as the initial value. The control device 60 may store the initial value of the ratio between the beam current measurement values respectively measured by the left and right side cups 42L and 42R, or may store the initial value of the ratio between the beam current measurement values respectively measured by the plurality of tuning cups 47a to 47d. The control device 60 may store the initial value of the ratio between the beam current measurement values respectively measured by the side cups 42 and the tuning cup 47.

The control device 60 may determine whether or not the calibration process needs to be performed, based on the ratio between the beam current measurement values measured by various Faraday cups during the preparation process. For example, the control device 60 may compare the initial value of the ratio between the beam current measurement values measured by the first Faraday cup and the third Faraday cup during the calibration process in the initial state with the ratio between the beam current measurement values measured by the first Faraday cup and the third Faraday cup during the preparation process. In a case where the difference between both of these ratios exceeds a first threshold, the control device 60 may perform the calibration process. The control device 60 may determine that the measurement system is abnormal to some extent, and may output an alert, in a case where a difference between the initial value of the ratio between the beam current measurement values measured by the first Faraday cup and the third Faraday cup during the calibration process in the initial state and the ratio between the beam current measurement values measured by the first Faraday cup and the third Faraday cup during the preparation process exceeds a second threshold greater than the first threshold.

The control device 60 may determine whether or not the calibration process needs to be performed or may output the alert, based on the ratio between the beam current measurement values measured by the plurality of third Faraday cups during the preparation process. For example, the control device 60 may compare the initial value of the ratio between the beam current measurement values measured by the plurality of third Faraday cups during the calibration process in the initial state with the ratio between the beam current measurement values measured by the plurality of third Faraday cups during the preparation process. In a case where the difference between both of these ratios exceeds a third threshold, the control device 60 may perform the calibration process. The control device 60 may determine that the measurement system is abnormal to some extent, and may output the alert, in a case where the difference between the initial value of the ratio between the beam current measurement values measured by the plurality of third Faraday cups during the calibration process in the initial state and the ratio between the beam current measurement values measured by the plurality of third Faraday cups during the preparation process exceeds a fourth threshold greater than the third threshold.

The control device 60 may determine whether or not the calibration process needs to be performed or may output the alert, based on a change amount of the ratio between the beam current measurement values measured by various Faraday cups during the preparation process. The control device 60 may perform the calibration process or may output the alert, in a case where the change amount of the ratio between the beam current measurement values measured by various Faraday cups during the preparation process exceeds a predetermined threshold value.

According to the present embodiment, it is possible to automatically detect whether or not the first Faraday cup needs recalibration or the maintenance work, based on the beam current measurement values respectively measured by the first Faraday cup and the third Faraday cup during the preparation process. In a case where it is detected that the first Faraday cup needs the recalibration, the calibration process is automatically performed. In this manner, the calibration parameter of the first Faraday cup can be automatically updated to a proper value. As a result, even in a case where the ion implanter 10 is continuously used over a long period of time, it is possible to maintain a state where the first Faraday cup is very accurately calibrated, and it is possible to maintain a state where the measurement accuracy using the first Faraday cup is high.

In the present embodiment, the first profiler cup 44a and the second profiler cup 44b may not be configured to measure the beam currents on the same measurement surface MS. For example, the first profiler cup 44a may be configured to measure the beam current on the first measurement surface MS that coincides with the wafer processing surface WS. On the other hand, the second profiler cup 44b may be configured to measure the beam current on the second measurement surface shifted from the first measurement surface MS in the beam traveling direction. The second profiler cup 44b may be disposed on the upstream side of the first profiler cup 44a in the beam traveling direction, or may be disposed on the downstream side of the first profiler cup 44a in the beam traveling direction.

In the present embodiment, the first profiler cup 44a and the second profiler cup 44b may not be configured to be movable in parallel with each other. For example, in a case where the first profiler cup 44a is configured to be movable in a first direction perpendicular to the beam traveling direction and the second profiler cup 44b is configured to be movable in a second direction perpendicular to the beam traveling direction, the first direction and the second direction may not be parallel to each other. For example, whereas the first direction may be the x-direction, the second direction may be the y-direction. In this case, the second measurement position 77 has to overlap at least one of the plurality of first measurement positions 76 when viewed in the beam traveling direction.

Figure 7:
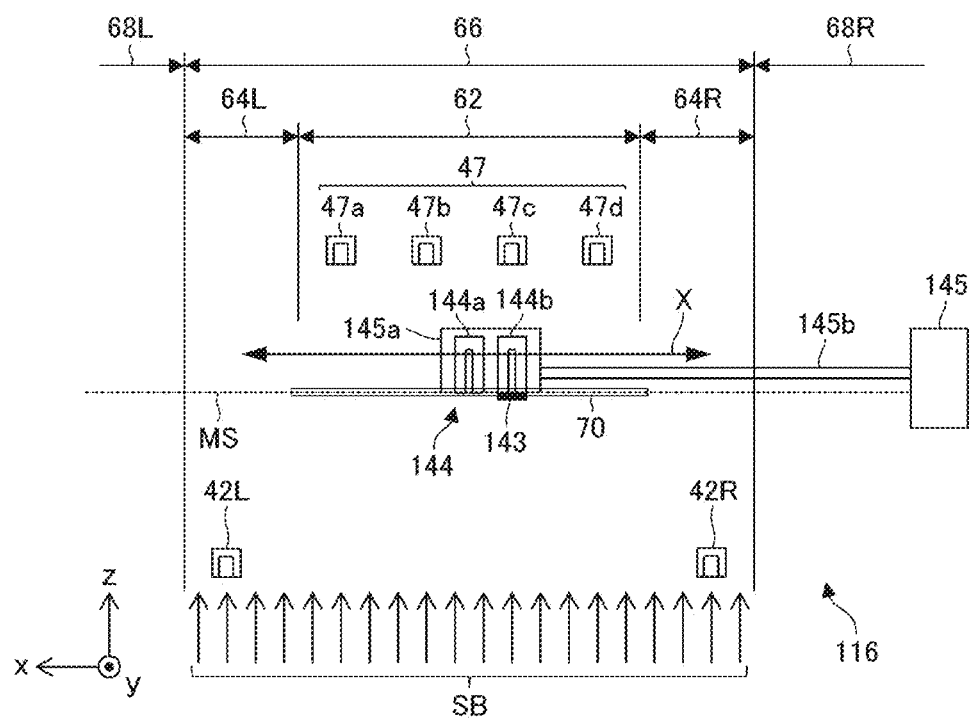
FIG. 7 is a top view schematically illustrating a configuration inside an implantation processing chamber according to another embodiment.

FIG. 7 is a top view schematically illustrating a configuration inside an implantation processing chamber 116 according to another embodiment. In the present embodiment, the first profiler cup 144a and the second profiler cup 144b are mounted on the same stage 145a, and are configured to move together in the x-direction along the same drive shaft 145b. With regard to the present embodiment, points different from those according to the above-described embodiment will be mainly described.

The implantation processing chamber 116 has the side cups 42L and 42R, a profiler cup 144, and a plurality of tuning cups 47 (47a to 47d). The side cups 42L and 42R and the plurality of tuning cups 47 are configured in the same manner as in the above-described embodiment. The profiler cup 144 includes a first profiler cup 144a and a second profiler cup 144b. The first profiler cup 144a is a first Faraday cup for normal measurement, and the second profiler cup 144b is a second Faraday cup for calibration.

A profiler driving device 145 moves the profiler cup 144 in the x-direction. The profiler driving device 145 includes a stage 145a and a drive shaft 145b. The stage 145a is configured to be movable in the x-direction along the drive shaft 145b. The first profiler cup 144a and the second profiler cup 144b are mounted on the stage 145a. The second profiler cup 144b is configured to be movable in the x-direction together with the first profiler cup 144a while a relative position of the second profiler cup 144b is fixed with respect to the first profiler cup 144a. The second profiler cup 144b is disposed adjacent to the first profiler cup 144a in the x-direction. The second profiler cup 144b is disposed so that the position in the beam traveling direction is the same as that of the first profiler cup 144a.

The blockade member 143 is attached to the second profiler cup 144b. The blockade member 143 is configured to be attachable to and detachable from the second profiler cup 144b. The blockade member 143 is fixed to the second profiler cup 144b by using a fastening member such as a screw or a bolt. The blockade member 143 is in a state of being attached to the second profiler cup 144b during the preparation process and the implantation process, and is in a state of being detached from the second profiler cup 144b during the calibration process. For example, the blockade member 143 is manually detached from the second profiler cup 144b under a situation where the implantation processing chamber 116 is opened to the atmosphere before the calibration process is performed. The blockade member 143 is manually attached to the second profiler cup 144b under the situation where the implantation processing chamber 116 is opened again to the atmosphere after the calibration process is performed. When the stage 145a moves in the x-direction during the preparation process and the implantation process, the blockade member 143 moves in the x-direction together with the second profiler cup 144b.

The blockade member 143 may be configured to be displaceable with respect to the second profiler cup 144b. The blockade member 143 may be configured to serve as a slide door or a flap door, and may be configured to be openable and closeable by a driving mechanism (not illustrated). The blockade member 143 may be configured to overlap the second profiler cup 144b when viewed in the beam traveling direction during the implantation process and the preparation process, and may be configured not to overlap the second profiler cup 144b when viewed in the beam traveling direction during the calibration process. The blockade member 143 may be cleaned or replaced at the same time when the maintenance work such as cleaning and replacement is carried out for the first profiler cup 144a.

According to the present embodiment, the second profiler cup 144b for calibration is provided separately from the first profiler cup 144a for normal measurement. In this manner, it is also possible to properly calibrate the beam current measurement value of the first profiler cup 144a. During the preparation process and the implantation process, the blockade member 143 is attached to the second profiler cup 144b. In this manner, it is possible to prevent the second Faraday cup from being worn out or getting dirty due to irradiation with the ion beam during a process other than the calibration process.

Figure 8:
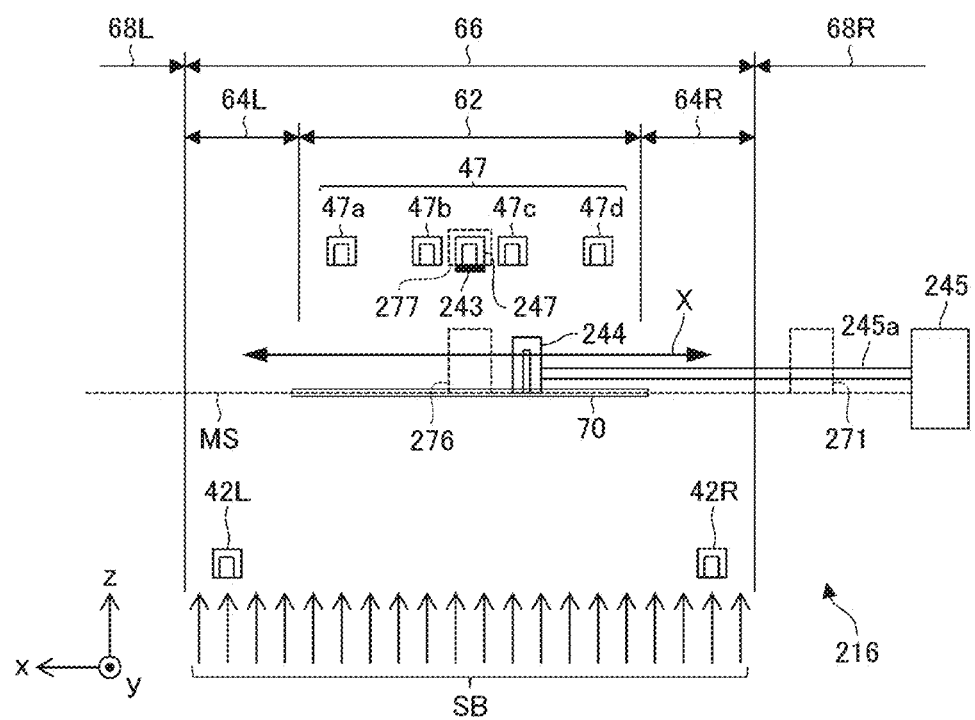
FIG. 8 is a top view schematically illustrating a configuration inside an implantation processing chamber according to still another embodiment.

FIG. 8 is a top view schematically illustrating a configuration inside an implantation processing chamber 216 according to still another embodiment. In the present embodiment, a tuning cup 247 for calibration which is disposed at the center of the implantation range 62 is used as the second Faraday cup for calibration. Therefore, in the present embodiment, the second Faraday cup for calibration is fixed to the implantation processing chamber 216, and is configured not to be movable. With regard to the present embodiment, points different from those according to the above-described embodiment will be mainly described.

The implantation processing chamber 216 has the side cups 42L and 42R, a profiler cup 244, the plurality of tuning cups 47 (47a to 47d), and a tuning cup 247 for calibration. The side cups 42L and 42R and the plurality of tuning cups 47 are configured in the same manner as in the above-described embodiments. The profiler cup 244 is a first Faraday cup for normal measurement. The tuning cup 247 for calibration is a second Faraday cup for calibration.

A profiler driving device 245 moves the profiler cup 244 in the x-direction. The profiler driving device 245 moves the profiler cup 244 at least between a first retreat position 271 and a first measurement position 276. The first measurement position 276 overlaps the tuning cup 247 for calibration when viewed in the beam traveling direction. In other words, a position of the first measurement position 276 in the directions (x-direction and y-direction) perpendicular to the beam traveling direction is the same as a position of the tuning cup 247 for calibration in the directions (x-direction and y-direction) perpendicular to the beam traveling direction. In the same manner as in the above-described embodiments, the profiler driving device 245 may move the profiler cup 244 to a plurality of first measurement positions, and the profiler can 244 may measure the beam current density distribution in the x-direction on the measurement surface MS.

The tuning cup 247 for calibration is disposed at the center of the implantation range 62, and is disposed between the second tuning cup 47b and the third tuning cup 47c. The tuning cup 247 for calibration is disposed at a position which overlaps the implantation position 70 when viewed in the beam direction. The tuning cup 247 for calibration is disposed on the beam stopper 46. Accordingly, the tuning cup 247 for calibration is disposed on the downstream side away from the implantation position 70 (or the measurement surface MS) in the beam traveling direction. The position where the tuning cup 247 for calibration is disposed can also be referred to as a second measurement position 277. Therefore, in the present embodiment, the second measurement position 277 overlaps the first measurement position 276 when viewed in the beam traveling direction, but is shifted from the first measurement position 276 in the beam traveling direction. That is, the second measurement position 277 is different from the first measurement position 276 in the beam traveling direction.

The tuning cup 247 for calibration can be disposed at any desired position on the beam stopper 46 as long as the position overlaps the implantation position 70 when viewed in the beam traveling direction. For example, the tuning cup 247 for calibration may be disposed between the first tuning cup 47a and the second tuning cup 47b, or may be disposed between the third tuning cup 47c and the fourth tuning cup 47d.

A blockade member 243 is attached to the tuning cup 247 for calibration. The blockade member 243 is configured to be attachable to and detachable from the tuning cup 247 for calibration. The blockade member 243 is fixed to the tuning cup 247 for calibration by using a fastening member such as a screw or a bolt. The blockade member 243 is in a state of being attached to the tuning cup 247 for calibration during the preparation process and the implantation process, and is in a state of being detached from the tuning cup 247 for calibration during the calibration process. For example, the blockade member 243 is manually detached from the tuning cup 247 for calibration under the situation where the implantation processing chamber 216 is opened to the atmosphere before the calibration process is performed. The blockade member 243 is manually attached to the tuning cup 247 for calibration under the situation where the implantation processing chamber 216 is opened again to the atmosphere after the calibration process is performed.

The blockade member 243 may be configured to be displaceable with respect to the tuning cup 247 for calibration, and may be configured to serve as a slide door or a flap door, for example. The blockade member 243 may be configured to overlap the tuning cup 247 for calibration when viewed in the beam traveling direction during the implantation process and the preparation process, and may be configured not overlap the tuning cup 247 for calibration when viewed in the beam traveling direction during the calibration process. The blockade member 243 may be cleaned or replaced at the same time when the maintenance work such as cleaning and replacement is carried out for the profiler cup 244.

According to the present embodiment, the tuning cup 247 for calibration is provided. In this manner, it is also possible to properly calibrate the beam current measurement value of the profiler cup 244. During the preparation process and the implantation process, the blockade member 243 is attached to the tuning cup 247 for calibration. In this manner, it is possible to prevent the tuning cup 247 for calibration from being worn out or getting dirty due to irradiation with the ion beam during a process other than the calibration process.

Hitherto, the present invention has been described with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various modifications such as design changes can be added to the embodiment. The embodiment having the alterations can also be included in the scope of the present invention.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
an implantation processing chamber in which an implantation process of irradiating a wafer with an ion beam is performed;
a first Faraday cup disposed inside the implantation processing chamber to measure a beam current of the ion beam during a preparation process performed before the implantation process;
a second Faraday cup disposed inside the implantation processing chamber to measure a beam current of the ion beam during a calibration process for calibrating a beam current measurement value of the first Faraday cup; and
a blockade member for blocking the ion beam directed toward the second Faraday cup, the blockade member being configured so that the ion beam is not incident into the second Faraday cup during the implantation process and the preparation process, and the ion beam is incident into the second Faraday cup during the calibration process.

2. The ion implanter according to claim 1,
wherein the first Faraday cup is movable between a first measurement position and a first retreat position in a first direction perpendicular to a beam traveling direction of the ion beam, the first measurement position overlaps an implantation position where ions are implanted into the wafer during the implantation process when viewed in the beam traveling direction, and the first retreat position does not overlap the implantation position when viewed in the beam traveling direction, and
wherein the second Faraday cup is movable between a second measurement position and a second retreat position in a second direction perpendicular to the beam traveling direction, the second measurement position overlaps the first measurement position when viewed in the beam traveling direction, and the second retreat position does not overlap the implantation position when viewed in the beam traveling direction.

3. The ion implanter according to claim 2,
wherein the second Faraday cup is movable independently of the first Faraday cup.

4. The ion implanter according to claim 3,
wherein the second direction is parallel to the first direction, and the second retreat position is located on a side opposite to the first retreat position across the implantation position.

5. The ion implanter according to claim 2,
wherein the second Faraday cup is movable together with the first Faraday cup while a relative position of the second Faraday cup is fixed with respect to a position of the first Faraday cup.

6. The ion implanter according to claim 5,
wherein the second Faraday cup is disposed adjacent to the first Faraday cup in the first direction.

7. The ion implanter according to claim 2,
wherein the second measurement position is located at the same position as the first measurement position in the beam traveling direction.

8. The ion implanter according to claim 2,
wherein the second measurement position is located at a position different from the first measurement position in the beam traveling direction.

9. The ion implanter according to claim 1,
wherein the first Faraday cup is movable between a first measurement position and a first retreat position in a first direction perpendicular to a beam traveling direction of the ion beam, the first measurement position overlaps an implantation position where ions are implanted into the wafer during the implantation process when viewed in the beam traveling direction, and the first retreat position does not overlap the implantation position when viewed in the beam traveling direction, and
wherein the second Faraday cup is fixed at a second measurement position, the second measurement position is located on a downstream side of the first measurement position in the beam traveling direction, and the second measurement position overlaps the first measurement position when viewed in the beam traveling direction.

10. The ion implanter according to claim 2, further comprising:
a beam scanner that performs reciprocating scanning with the ion beam in the first direction,
wherein the first Faraday cup is capable of measuring a beam current of the ion beam at a plurality of the first measurement positions different in the first direction, and
wherein the second Faraday cup is capable of measuring the beam current of the ion beam at the second measurement position which overlaps at least one of the plurality of first measurement positions when viewed in the beam traveling direction.

11. The ion implanter according to claim 1,
wherein the blockade member is displaceable with respect to the second Faraday cup, is disposed to overlap the second Faraday cup when viewed in a beam traveling direction of the ion beam during the implantation process and the preparation process, and is disposed not to overlap the second Faraday cup when viewed in the beam traveling direction during the calibration process.

12. The ion implanter according to claim 1,
wherein the blockade member is attachable to and detachable from the second Faraday cup, is attached to the second Faraday cup during the implantation process and the preparation process, and is detached from the second Faraday cup during the calibration process.

13. The ion implanter according to claim 2,
wherein the second Faraday cup is located at the second retreat position during the implantation process and the preparation process, and
wherein the blockade member is disposed to block an entrance of the second Faraday cup located at the second retreat position.

14. The ion implanter according to claim 1, further comprising:
a control device that determines a calibration parameter for calibrating beam current measurement values of the first Faraday cup, based on the beam current measurement values measured by the first Faraday cup and the second Faraday cup, respectively, during the calibration process.

15. The ion implanter according to claim 14,
wherein the control device stores an initial value of the calibration parameter, updates a value of the calibration parameter in a case where a difference between a value of the calibration parameter determined during the calibration process and the initial value of the calibration parameter falls within a predetermined range, and outputs an alert without updating the value of the calibration parameter in a case where the difference does not fall within the predetermined range.

16. The ion implanter according to claim 14, further comprising:
a third Faraday cup that measures a beam current of the ion beam,
wherein the control device stores an initial value of a ratio between beam current measurement values measured by the first Faraday cup and the third Faraday cup, and determines the calibration parameter by performing the calibration process in a case where a difference between a ratio between the beam current measurement values measured by the first Faraday cup and the third Faraday cup during the preparation process and the initial value of the ratio exceeds a predetermined threshold value.

17. The ion implanter according to claim 14, further comprising:
a third Faraday cup that measures a beam current of the ion beam,
wherein the control device monitors a ratio between beam current measurement values measured by the first Faraday cup and the third Faraday cup, and determines the calibration parameter by performing the calibration process in a case where a change amount of the monitored ratio exceeds a predetermined threshold value.

18. The ion implanter according to claim 16,
wherein the third Faraday cup measures a beam current of the ion beam at a position which does not overlap an implantation position where ions are implanted into the wafer during the implantation process when viewed in a beam traveling direction of the ion beam.

19. The ion implanter according to claim 16,
wherein the third Faraday cup measures a beam current of the ion beam at a position which overlaps an implantation position where ions are implanted into the wafer during the implantation process when viewed in a beam traveling direction of the ion beam.

20. An ion implantation method comprising:
an implantation process of irradiating a wafer with an ion beam;
a preparation process of measuring a beam current of the ion beam by using a first Faraday cup before the implantation process; and
a calibration process of measuring the beam current of the ion beam by using a second Faraday cup, and calibrating a beam current measurement value of the first Faraday cup,
wherein during the implantation process and the preparation process, the ion beam directed toward the second Faraday cup is blocked by a blockade member, and the ion beam is not incident into the second Faraday cup, and during the calibration process, the ion beam is incident into the second Faraday cup.

* * * * *